United States Patent [19]

Moon

[11] Patent Number: 6,163,498
[45] Date of Patent: Dec. 19, 2000

[54] METHODS AND SYSTEMS FOR COLUMN LINE SELECTION IN A MEMORY DEVICE

[75] Inventor: Byung-sick Moon, Seoul, Rep. of Korea

[73] Assignee: Samsung Electronics Co., Ltd., Rep. of Korea

[21] Appl. No.: 09/396,144

[22] Filed: Sep. 15, 1999

[30] Foreign Application Priority Data

Sep. 17, 1998 [KR] Rep. of Korea ............... 98-38412

[51] Int. Cl.[7] ................................. G11C 8/00
[52] U.S. Cl. ...................... 365/230.06; 365/189.05; 365/194
[58] Field of Search .............. 365/230.06, 230.08, 365/233, 194, 189.05

[56] References Cited

U.S. PATENT DOCUMENTS

5,883,851  3/1999  Lee ........................ 365/230.03
5,963,467  10/1999  Miyatake et al. ............ 365/149

*Primary Examiner*—David Nelms
*Assistant Examiner*—Thong Le
*Attorney, Agent, or Firm*—Myers Bigel Sibley & Sajovec

[57] ABSTRACT

An integrated circuit device is provided having a column selection circuit which activates the column selection line output responsive to a column latch signal rather than a data command signal. The leading edge of the column latch signal is used to generate a master clock signal and to latch the selected address. The master clock signal is delayed and a column decoder circuit decodes the latched selected address to activate the appropriate column selection line output responsive to the delayed clock. As activation of the column selection line output initiates placement of the desired sense amplified bit line signal on the local input and output lines, the voltage differential on the local input and output lines can begin to develop earlier than with the prior art approaches. Therefore, the voltage levels on the local input and output lines may reach the desired levels before or shortly after the data command signal is activated thereby allowing the input and output sense amplifier to be enabled and output the read data shortly after the data command signal is activated. Write operations may be similarly supported. Methods are also provided.

12 Claims, 5 Drawing Sheets

METHODS AND SYSTEMS FOR COLUMN LINE SELECTION IN A MEMORY DEVICE

FIELD OF THE INVENTION

The present invention relates to semiconductor integrated circuit devices, and more particularly to semiconductor memory devices having column selection addressing and methods for operating the same.

BACKGROUND OF THE INVENTION

Integrated circuit devices, such as high speed semiconductor memory devices, typically input and output data in-synch with an externally applied clock signal. For example, in a high speed semiconductor memory device, data input and output operations may utilize an internal clock signal. In general, in order to improve the performance of a computer system or other device utilizing such memory devices, it is necessary to increase the operating speed of a central processing unit (CPU) and the operation speed of a memory device for storing data and programs requested by the CPU (for example by increasing the speed of the applied clock signal). Recently, in order to improve the operating speed of memory devices to support higher clock rates, a fast page mode dynamic random access memory (DRAM), an extended data output (EDO) DRAM, a synchronous DRAM, a double data rate (DDR) DRAM, and a rambus DRAM have been developed. The operating speed of the memory device is generally increased under various conditions with each of the above DRAMs by increasing the amount of input and output data (bandwidth) accessed per unit time.

However, in the case of some high speed memory devices, such as the rambus DRAM, in which an address latch signal and a column control signal are input at different points in time, the operating speed of the memory device may be limited due to a delay in data access time (hereinafter referred to as $t_{DAC}$) between the point in time at which the column control signal is received to the point in time at which a data signal (RD) is output by the memory device.

Figure 1:
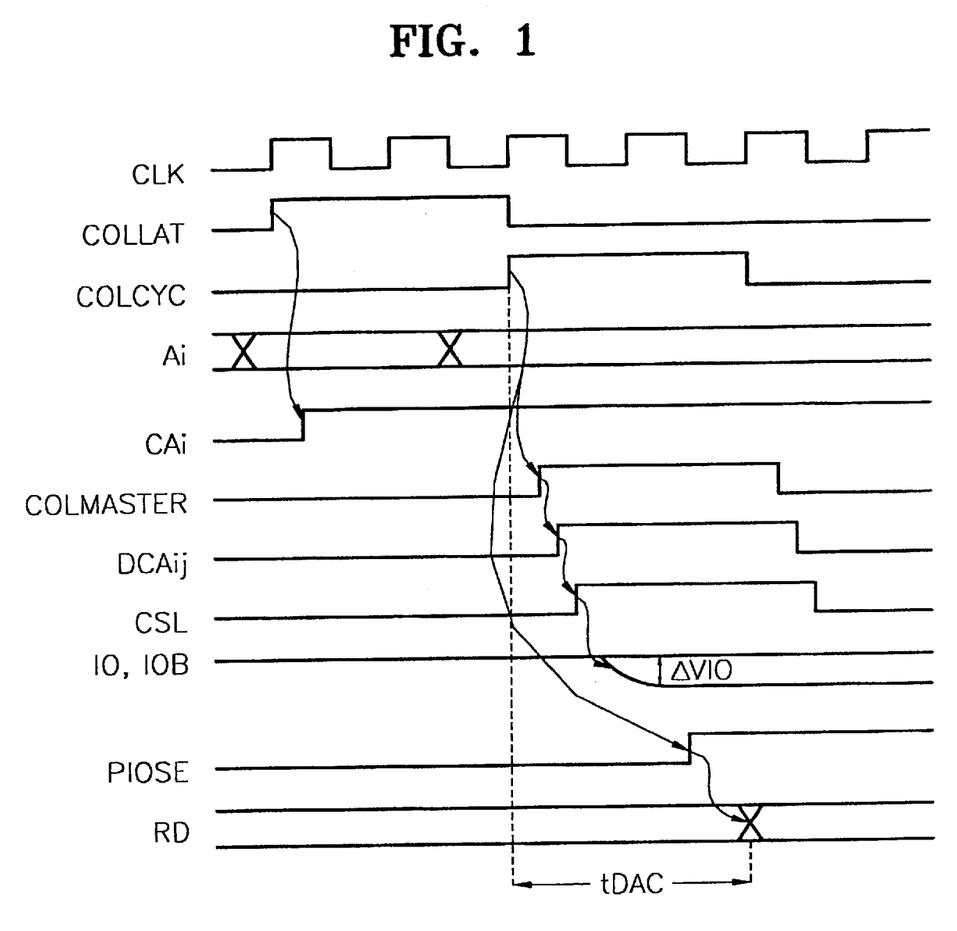
FIG. 1 is a timing diagram illustrating column selection and memory access operations and a resulting delay time $t_{DAC}$ in a conventional memory device.

The delay time in memory access will now be further described with referrence to FIG. 1. FIG. 1 is a timing diagram illustrating various signals on such a memory device which illustrates the factors which may impact the $t_{DAC}$ in such a conventional memory device. As shown in FIG. 1, the memory device synchronizes memory access operations with reference to a system clock signal CLK, a column latch signal COLLAT and an input/output data command signal COLCYC (hereinafter referred to as a data command signal). One memory read access cycle is shown in FIG. 1. An address input Ai designating the desired memory location for an input or output operation is received by the memory device and synchronized with the system clock signal CLK. The address input Ai is used to generate a column address CAi in response to the column latch signal COLLAT.

A master clock signal COLMASTER is generated in response to the data command signal COLCYC. A decoded column address DCAij is generated from the address input Ai responsive to the master clock signal COLMASTER. Furthermore, a column selection signal CSL for driving a column selection line corresponding to the decoded column address DCAij is activated also in response to the master clock signal COLMASTER.

When the column selection signal CSL is activated (which for the illustrated embodiment is illustrated as the high level), data amplified by a bit line sense amplifier is loaded onto a pair of local input and output lines IO and IOB. As understood by those of skill in the art and figuratively illustrated in FIG. 1 on the IO, IOB line by the ramped signal transition, a differential voltage signal is generated over a period of time between the input and output line IO and the complementary input and output line IOB after the data amplified by the bit line sense amplifier is loaded.

Also shown in FIG. 1, an input and output sense amplifier enable signal PIOSE is enabled or activated (shown in FIG. 1 as a high level) responsive to data command signal COLCYC. The output sense amplifier enable signal PIOSE is used to enable an output sense amplifier which outputs the data signal RD. As shown in FIG. 1, the timing of enable events for the conventional device illustrated is arranged by the use of the COLLAT and COLCYC signals so that the output sense amplifier is not enabled by the PIOSE signal until a point in time at which the voltage difference ΔVIO is no less than a specified value. In other words, PIOSE is not enabled until an appropriate delay time after the pair of local input and output lines IO and IOB have been loaded.

As shown in FIG. 1, the time delay of interest, $t_{DAC}$, is the time from the point in time at which the data command signal COLCYC (also corresponding to the column control signal) is activated, to the point in time at which the data signal RD is output. The $t_{DAC}$ is a recognized parameter for establishing the operating speed, and, particularly, the read speed, of the memory device.

The duration of $t_{DAC}$ may be unacceptable for certain applications because the column selection signal CSL is itself activated (high level in FIG. 1) responsive to the data command signal COLCYC. The data signal RD should only be output after the data signal of the pair of local input and output lines IO and IOB is developed and a certain voltage difference ΔVIO is generated between the pair of input and output lines IO and IOB. However, as the master clock signal COLMASTER is first generated to decode columns and the column selection line is activated in order to develop the data signal in the pair of local input and output lines IO and IOB, both operations involving a certain time to complete, the operating speed of the memory device may be limited by the sequence of events in reliably generating the data signal in the pair of local input and output lines IO and IOB for output as the data signal RD. In other words, based on the operations sequence as shown in the prior art approach of FIG. 1, the respective use of the column selection signal CSL and the data command signal COLCYC may reduce the data read speed.

SUMMARY OF THE INVENTION

It is, therefore, an object of the present invention to provide a column selection line driver and memory device which may provide for an increased data read speed.

It is a further object of the present invention to provide methods for driving a memory device which may provide increased data read speed.

In order to provide for the foregoing objectives, an integrated circuit device is provided having a column selection circuit which activates the column selection line output responsive to a column latch signal rather than a data command signal. The leading edge of the column latch signal is used to generate a master clock signal and to latch the selected address. The master clock signal is delayed and a column decoder circuit decodes the latched selected address to activate the appropriate column selection line output responsive to the delayed clock. As activation of the column selection line output initiates placement of the desired sense amplified bit line signal on the local input and output lines, the voltage differential on the local input and output lines can begin to develop earlier than with the prior art approaches. Therefore, the voltage levels on the local input and output lines may reach the desired levels before or shortly after the data command signal is activated thereby allowing the input and output sense amplifier to be enabled and output the read data shortly after the data command signal is activated. Write operations may be similarly supported.

In one embodiment of the present invention a memory device is provided including a memory array having bit line outputs and an interface circuit outputting a column latch signal, a data command signal and an address associated with the memory array. A column selection line circuit is provided on the memory device which is configured to decode the address responsive to the column latch signal and to activate a column selection line signal associated with a selected column of the memory array based on the decoded address responsive to a leading edge of the column latch signal. A sense amplifier is provided coupled to the bit line outputs of the memory array and having an amplified output which outputs amplified bit line data from the memory array. Finally, a column selector circuit is coupled to the column selection line signal and the amplified output of the sense amplifier and outputs selected amplified bit line data from the sense amplifier associated with the selected column of the memory array responsive to the column selection line signal.

In a further embodiment of the memory device aspect of the present invention, the column selection line circuit further includes a column selection line circuit configured to deactivate the column selection line signal responsive to a leading edge of the data command signal. In addition, a column address latch is provided which is configured to latch the address responsive to a leading edge of the column latch signal. In this embodiment, the column selection line circuit decodes the latched address and the column selection line circuit further comprises a delay circuit to delay activation of the column selection line for a selected time after the column address latch latches the address. In one embodiment, the memory device includes and input/output sense amplifier enable circuit configured to generate an enable output responsive to the leading edge of the data command signal and an input/output sense amplifier coupled to the selected amplified bit line data output of the column selector circuit, the input/output sense amplifier outputting read data corresponding to the selected amplified bit line data output of the column selector circuit responsive to the enable output of the input/output sense amplifier.

In a further aspect of the present invention, a column selection line driver for a memory device is provided including a column selection line circuit having a column selection line output and a column latch signal input, the column selection line circuit being configured to provide an activated signal on the column selection line output responsive to a column latch signal on the column latch signal input. The column selection line circuit may include a master clock signal generator coupled to the column latch signal input and having a clock signal output which is activated responsive to the column latch signal on the column latch signal input, a column address latch having a column latch signal input and a column address output which is latched responsive to a column latch signal input on the column latch signal input and a column decoder circuit coupled to the clock signal output and the column address output and the column selection line output, the column decoder circuit driving the column selection line output responsive to the clock signal input. The clock signal output may be activated responsive to a leading edge of the column latch signal.

In one embodiment of the present invention, the master clock signal generator includes a first pulse generator coupled to the column latch input that generates an activate pulse responsive to the leading edge of the column latch input signal and a master clock output device that activates the clock signal output responsive to the activate pulse. The master clock signal generator may further include a second pulse generator coupled to a data command signal input of the master clock signal generator that generates a deactivate pulse responsive to a leading edge of a data command signal on the date signal input. In this embodiment, the master clock output device deactivates the clock signal output responsive to the deactivate pulse.

The first pulse generator in another embodiment includes an inverter having an input coupled to the column latch input and having an associated delay and a pulse output circuit having an input coupled to the column latch input and an input coupled to an output of the invertor wherein the activate pulse is generated when both the column latch input and the output of the invertor are activated. The master clock output device may include a first transistor having a source coupled to a high voltage, the transistor being activated responsive to the activate pulse and a second transistor having a drain connected to a low voltage reference, the second transistor being activated responsive to the deactivate pulse. A latch having an input coupled to the drain of the first transistor and the drain of the second transistor may also be included in the master clock output device.

In another embodiment of the present invention, the column selection line driver further includes a delay circuit outputting a delayed clock signal responsive to the clock signal output of the master clock signal generator and wherein the column decoder circuit drives the column selection line output responsive to the delayed clock signal. The memory device may be, for example, a rambus DRAM.

In a further aspect of the present invention, methods are provided for driving a memory device. A selected column selection line is activated responsive to a leading edge of a column latch signal. Data is output from a memory cell of the memory device amplified by a bit line sense amplifier to a local input/output line responsive to activation of the selected column selection line. An input/output sense amplifier enable signal is activated responsive to a leading edge of a data command signal and data from the local input/output line is amplified with an input/output sense amplifier responsive to the input/output sense amplifier enable signal. The selected column selection line may then be deactivated responsive to the leading edge of the data command signal.

In one embodiment of the method aspects of the present invention, operations for activating the column selection line include generating a master clock responsive to a leading edge of the column latch signal and delaying the master clock a selected time to provide a delayed master clock. An address is decoded responsive to the delayed master clock. The selected column selection line to activate is selected responsive to the decoded address and then the selected column selection line is activated.

DESCRIPTION OF PREFERRED EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. Like numbers refer to like elements throughout and signal lines and signals thereon may be referred to by the same reference symbols.

Figure 2:
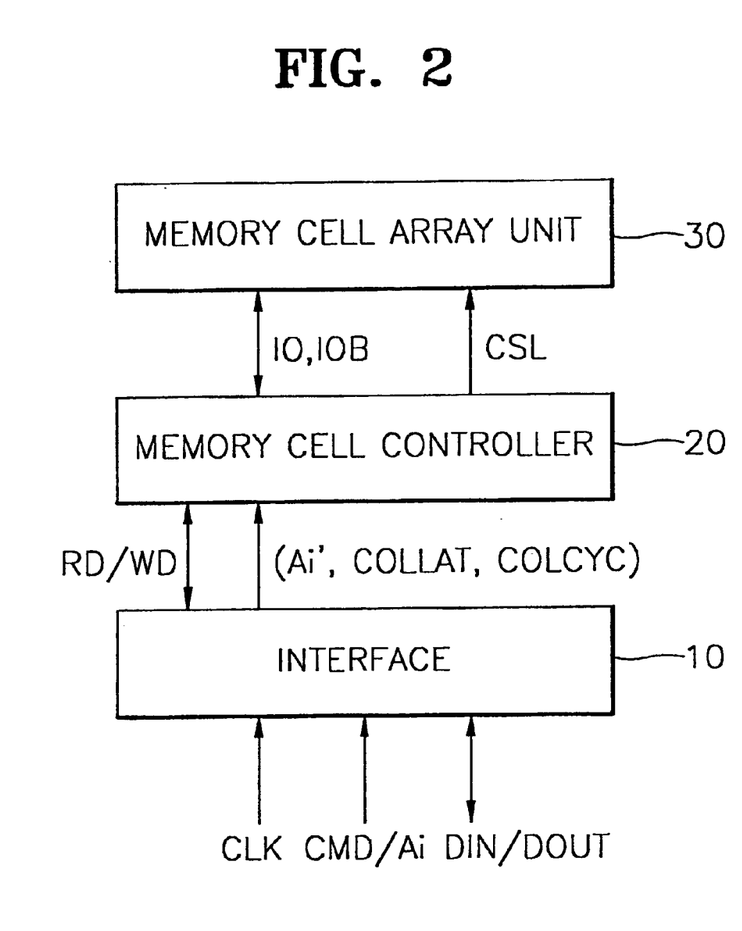
FIG. 2 is a block diagram illustrating a memory device according to an embodiment of the present invention.

Referring now to FIG. 2, a block diagram is provided illustrating a memory device according to the present invention. More particularly, the embodiment of FIG. 2 illustrates a rambus DRAM. The rambus DRAM receives an address latch signal and a column control signal as inputs at different points in time. It is to be understood that this particular embodiment is provided for the purposes of illustration only and that the benefits of the present invention may be obtained in other types of memory devices.

As shown in FIG. 2, the memory device includes an interface 10, a memory cell controller 20, and a memory cell array 30. The interface 10 receives a command signal CMD synchronized with a clock signal CLK through input pins (not shown) and an address Ai and generates signals for controlling memory access. For example, as shown in FIG. 2, control signals including a column latch signal COLLAT and a data command signal COLCYC as well as an address Ai' are output by the interface 10. The interface 10 also receives data input/output DIN/DOUT and outputs a read/write data signal RD/WD. Note that the signals DIN/DOUT and RD/WD are illustrated as bidirectional depending on whether a write or read access is underway for the memory cell array unit 30. The interface 10 receives data DIN through data input and output pins (not shown) in an input mode with which it generates a write data signal WD. The interface 10 receives read data signal RD output from the memory cell controller 20 in an output mode with which it generates the output data DOUT. For ease of understanding, operations will be described herein with reference to a read operation unless noted otherwise. It is to be understood, however, that the present invention may be applied to both read and write operations.

The column latch signal COLLAT is a control signal for latching a column address which indicates that the output address Ai' is the selected column address. The data command signal COLCYC is a control signal which controls read and write operations of the column and which, as shown in FIG. 1, is activated after the column latch signal COLLAT is activated. The generation of COLLAT and COLCYC and the relationship therebetween is known to those of skill in the art and will not be discussed further herein.

The memory cell controller 20 receives the column address Ai' and the command signals COLLAT and COLCYC from the interface 10 and generates a plurality of signals for accessing the selected address of the memory cell array 30, including the column selection signal CSL. The memory cell controller 20 writes the write data signal WD received from the interface 10 into the addressed memory cell in the memory cell array 30, or outputs the read data signal RD received from the memory cell array 30, responsive to the column selection signal CSL.

Signal transmission between the memory cell controller 20 and the memory cell array 30 is provided through local input and output lines IO and IOB. The memory cell controller 20 includes a column selection line driving circuit which generates the column selection signal CSL. A more detailed block diagram of an embodiment of a column selection line driver according to the present invention is shown in FIG. 3.

Figure 3:
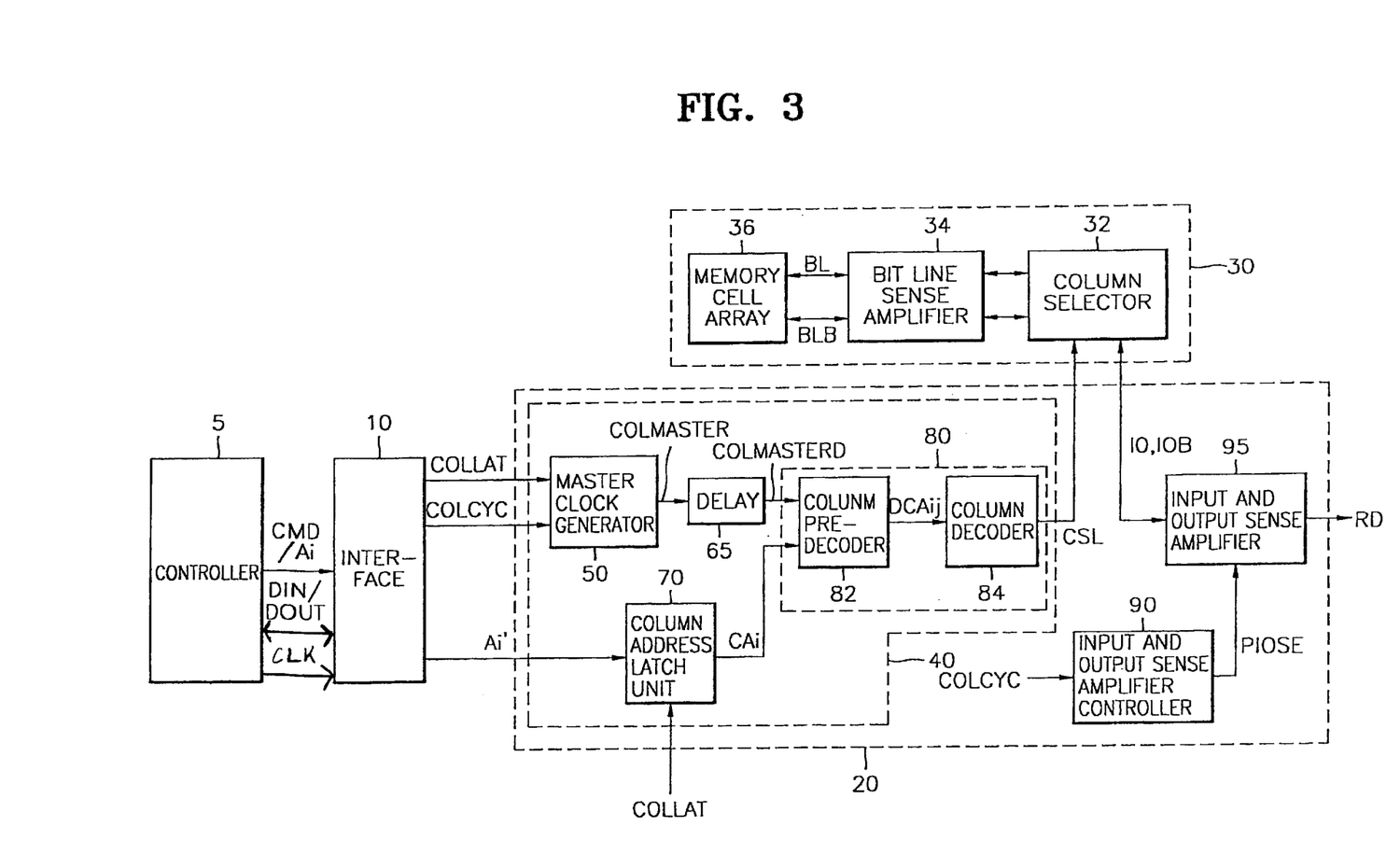
FIG. 3 is a block diagram illustrating a column selection line driver in a memory device according to an embodiment of the present invention.

Referring now to FIG. 3 a block diagram of a memory device according to an embodiment of the present invention is shown. More particularly, FIG. 3 illustrates the read data path for an embodiment of the memory cell controller 20 of FIG. 2. As shown in the embodiment of FIG. 3, the memory cell controller 20 includes a column selection line circuit 40, an input/output sense amplifier controller (or enable circuit) 90 configured to generate an enable output responsive to a leading edge of the data command signal COLCYC, and an input/output sense amplifier 95.

The column selection line circuit 40 decodes the received address Ai' responsive to the column latch signal COLLAT and the data command signal COLCYC which are generated by and output from a controller, such as a rambus controller 5, through the interface 10. The column selection signal CSL for driving the column selection line corresponding to the address Ai' is generated then generated by the column selection line circuit 40. It is to be understood that, while illustrated as a single line in FIG. 3, the column selection line signal is typically a plurality of lines (or bits) allowing selection of a particular one of the plurality of columns of memory cell array unit 30.

The column selection line signal output CSL is activated responsive to the column latch signal COLLAT. More particularly, the column selection line output signal COLLAT is activated responsive to a leading edge of the column latch signal as will be discussed further with reference to FIG. 5. Furthermore, in the illustrated embodiment, the column selection line output signal COLLAT is deactivated responsive to a leading edge of the data command signal COLCYC. As used herein, the phrase "activated" and the phrase "enabled" on binary signal control lines refers to the triggered state of a signal. For a multiple bit signal line, such as CSL, the activated state refers to a selected state reflecting a new desired state such as the state associated with selecting the desired column for a read or write operation. For purposes of the timing diagrams and discussion herein, the activated or enabled state will be illustrated as the high voltage state. However, it is to be understood that the present invention could be implemented using inverted logic wherein the activated state would be represented by the low voltage state of a line in the memory device. Similarly, while for the high level activated state described herein a leading edge is a rising edge, the inverted state would encompass a falling edge as the leading edge for a signal line.

As shown in FIG. 3, the column selection line circuit 40 includes a master clock signal generator 50, a column address latch unit 70 and a column decoder circuit 80. The master clock signal generator 50 outputs a master clock signal output COLMASTER which is activated responsive to the column latch signal COLLAT input to the master clock signal generator 50. More particularly, the clock signal output is activated responsive to a leading edge of the column latch signal input. In addition, for the illustrated embodiment, the clock signal output COLMASTER is disabled responsive to a leading edge of the data command signal COLCYC.

The column address latch 70 outputs a column address output CAi which is based on the received address Ai' and output responsive to the column latch signal COLLAT. The column decoding unit 80 generates the column selection signal CSL for driving the column selection line corresponding to the column address CAi by inputting the master clock signal COLMASTER and the column address CAi. The column decoder circuit 80 as illustrated in FIG. 3 includes a column pre-decoder 82 and a column decoder 84. The column pre-decoder 82 outputs a decoded column address DCAij from the column address CAi responsive to the master clock signal COLMASTER.

The column selection line circuit 40 in the embodiment of FIG. 3 further includes a delay circuit 65 for receiving the master clock signal COLMASTER, delaying the master clock for a certain time, and outputting a delayed master clock signal COLMASTERD. In this embodiment, the column decoder circuit is responsive to the delayed clock signal, thereby providing a time delay for column address latch unit 70 to properly output the selected address CAi responsive to the column latch signal COLLAT before the delayed clock signal leading edge is input to the column decoder circuit 80.

The column selection line output signal CSL generated by the column selection line circuit 40 is provided as an input to a column selector circuit 32 included in the memory cell array 30. The column selector circuit 32 transfers sense amplified bit line data read from a memory cell array 36 to the local input and output lines IO and IOB responsive to the activation of the column selection line output signal CSL. More particularly, the column selector 32 outputs the selected amplified bit line data from the sense amplifier 34 associated with the selected column of the memory cell array 36 responsive to the column selection line output signal CSL designating the desired column. The bit line data is sensed and amplified by a bit line sense amplifier 34. Note that, while not shown in the figures or described herein, it is to be understood that the illustrated memory device would also include row selection circuitry as known to those of skill in the art for use in addressing memory locations.

Also shown in the memory cell controller 20 of FIG. 3 is the input/output sense amplifier enable circuit 90 which generates an input/output sense amplifier enable signal PIOSE activated responsive to the data command signal COLCYC. The input/output sense amplifier 95 senses and amplifies the bit line data signal on the local input and output lines IO and IOB. The input/output sense amplifier 95 transfers the data signal on the local input and output lines to a global input and output (IO) line as the read data RD signal in response to the activation of the input/output sense amplifier enable signal PIOSE.

According to a preferred embodiment of the present invention, the column selection line output signal CSL is activated in response to the column latch signal COLLAT. The column selector 32 corresponding to the address selected by the column selection signal CSL is thereby activated. Accordingly, the bit line sense amplifier 34 and the local input and output lines IO and IOB are connected by the column selector 32. It is to be understood that, due to the characteristics of the physical devices affecting the rise time characteristics of a signal line following application of a signal, the bit line data signal amplified by the bit line sense amplifier 34 is developed over a period of time on the local input and output lines IO and IOB. The bit line data signal developed on the local input and output lines IO and IOB is in turn output to the global input and output line through input/output sense amplifier 95 responsive to the data command signal COLCYC. As shown in the timing diagram of FIG. 5, the leading edge of the data command signal COLCYC arrives after the leading edge of the column latch signal COLLAT. The bit line data is output as the data signal RD by the input/output sense amplifier 95 responsive to activation of the enable signal PIOSE by input/output sense amplifier enable circuit 90 which in turn is activated responsive to the data command signal COLCYC.

According, as will be further explained with reference to FIG. 5, the present invention provides for placing the bit line signal onto the local input and output lines IO and IOB before the data command signal COLCYC is applied and the input/output sense amplifier 95 enabled. The data command signal COLCYC is then received initiating enablement of the input/output sense amplifier 95 to output the read data RD signal to the local input and output lines. Therefore, the time taken for the read data signal RD to be output from the application of the data command signal COLCYC, i.e., $t_{DAC}$ may be beneficially reduced.

Figure 4:
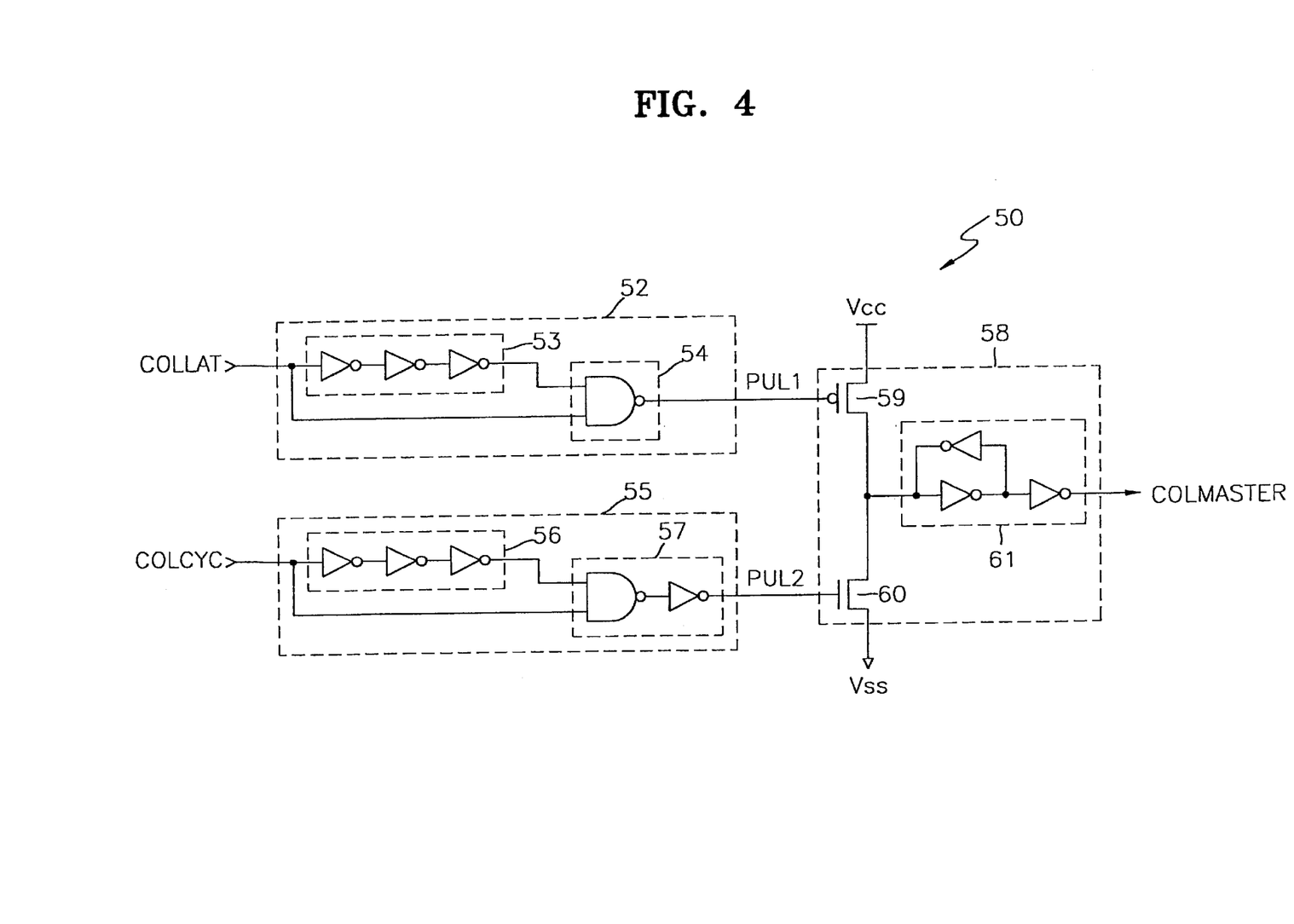
FIG. 4 is an electrical schematic diagram illustrating a master clock signal generator according to an embodiment of the present invention suitable for use in the embodiment of the column line selection driver of FIG. 3.

FIG. 4 is an electrical circuit diagram illustrating an embodiment of a master clock signal generator 50 suitable for use in the embodiment of the present invention shown in FIG. 3. The master clock signal generator 50 illustrated in FIG. 4 includes a first pulse generator 62, a second pulse generator 55, and a master clock output device 58.

The first pulse generator 52 generates a first (or activate) pulse PUL1 which is activated to a low level for a predetermined length of time in response to the leading edge of the column latch signal COLLAT. The first pulse generator 52 includes a first inverter 53 for receiving the column latch signal COLLAT and inverting and outputting the column latch signal COLLAT. The first invertor 53 has an associated delay provided, for example, by the number of inverters included creating a delay line of a desired length. The first invertor 53 also includes a first logic unit (or pulse output circuit) 54 which outputs the first (activate) pulse PUL1 when both the column latch signal COLLAT and the output signal of the first inverter 53 are activated. The first logic unit 54 is comprised of a logic gate, for example, a NAND gate, as shown in the illustrated embodiment. The width of the first pulse PUL1 is determined by the delay provided by the number of invertors included in the first inverter 53. The first pulse PUL1 is provided as an input signal to the master clock output device 58.

The second pulse generator 55 in master clock generator 50 generates a second (or deactivate) pulse PUL2 activated to a high level for a predetermined length of time responsive to the leading edge of the data command signal COLCYC. The second pulse generator 55 includes a second inverter 56 for receiving, inverting, and outputting the data command signal COLCYC and a second logic unit 57 for outputting the second pulse PUL2 activated to the high level when both the data command signal and the output signal of the second inverter 56 are activated. The second invertor 56 includes a plurality of invertors defining a delay line as with the first invertor 52. The second logic unit 57 is comprised of a logic gate, for example, a NAND gate and an inverter. The predetermined length of the second pulse PUL2 is determined by the number of invertors constructing the second inverter 56. The second pulse PUL2 is provided as an input signal to the master clock output device 58.

The master clock output device 58 generates the master clock signal COLMASTER which is activated in response to the first pulse PUL1 and deactivated in response to the second pulse PUL2. The master clock output device 58 includes a pull-up transistor 59, the source or drain of which is connected to a power voltage Vcc and which is enabled in response to the activation of the first pulse PUL1. It also includes a pull-down transistor 60, the source or drain of which is connected to a ground voltage Vss and which is disabled in response to the activation of the second pulse PUL2. Preferably, the pull-up transistor 59 and the pull-down transistor 60 are respectively comprised of a PMOS transistor and an NMOS transistor. The master clock output device 58 further includes a latch 61 which latches and outputs the output of the pull-up and the pull-down transistors 59 and 60.

In operation, when the column latch signal COLLAT is activated and input to the master clock signal generator 50, a first (activate) pulse PUL1 having a high level is output by the first pulse generator 52. The pull-up transistor 59 is enabled by the first pulse PUL1 and a high level master clock signal COLMASTER is generated. When the data command signal COLCYC is subsequently input to the second pulse generator 55 a certain lapse of time after the column latch signal COLLAT is activated, the second (deactivate) pulse PUL2 having a low level is generated. The pull-down transistor 60 is enabled by the second pulse and a low level Vss output is provided as master clock signal COLMASTER, i.e., the master clock signal is deactivated.

Figure 5:
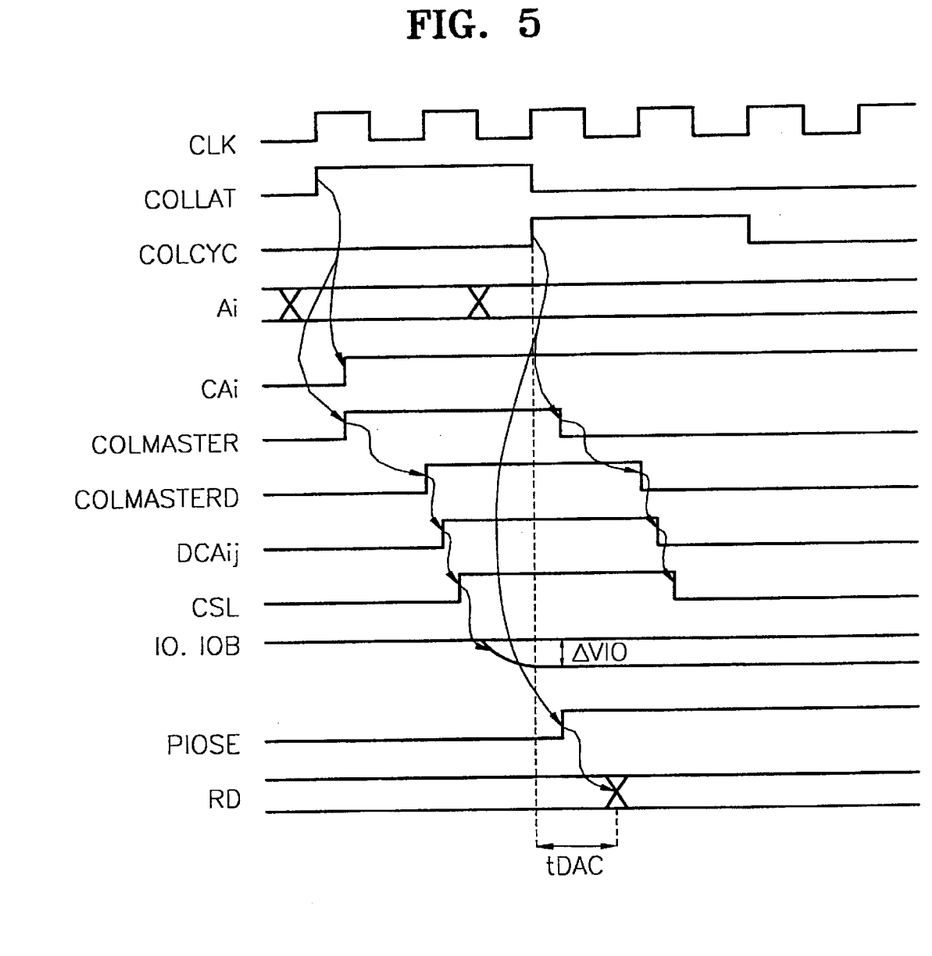
FIG. 5 is a timing diagram illustrating column selection and memory access operations and the resulting delay time $t_{DAC}$ according to the embodiment of the present invention shown in FIG. 3.

FIG. 5 is a timing diagram illustrating data read operations for the embodiment of the present invention shown in FIG. 3. The arrows between the signal lines in FIG. 5 generally correspond to the causal relationship between the respective signal lines as will be described. The sequence of signal events involved in generating the column select line output signal CSL will first be described. The received address Ai', synchronized with the clock CLK, is used by the column address latch unit 70 to generate the column address CAi responsive to the leading edge of the column latch signal COLLAT. The master clock signal output COLMASTER is activated in response to the leading edge of the column latch signal COLLAT. The column address CAi is used by the column pre-decoder 82 to generate the decoded column address DCAij responsive to the delayed master clock signal COLMASTERD from the delay circuit 65 which is obtained by delaying the master clock signal COLMASTER from master clock generator 50 for a selected delay time. The appropriate column selection line output signal CSL corresponding to the address input Ai' is activated by the column decoder 84 responsive to the decoded column address DCAij.

The read data output operations aspect of FIG. 5 will now be described. The bit line data signal BL, BLB is amplified by bit line sense amplifier 34 and provided to the local input and output lines IO and IOB by column selector 32 responsive to the activation of the column selection line output signal CSL. The timing provided for as described above in generating the CSL signal results in a voltage difference between the bit line data signal generated on the input and output line IO and the bit line data signal generated on the supplementary input and output line IOB being no less than a selected threshold value $\Delta$VIO before the input/output sense amplifier enable signal PIOSE is activated responsive to the leading edge of the data command signal COLCYC. The data signal of the local input and output lines IO and IOB is then output as the read data signal RD responsive to the enablement of the input/output sense amplifier 95 by the input/output sense amplifier enable signal PIOSE.

The present invention also includes aspects related to the resetting or deativation of the circuitry in preparation for a subsequent read or write operation. The column selection line output signal CSL is deactivated responsive to the leading edge of the data command signal COLCYC. To 0be more specific, the master clock signal COLMASTER is deactivated responsive to the leading edge of the data command signal COLCYC. The delayed master clock signal COLMASTERD is thereby deactivated responsive to the lagging edge of the master clock signal COLMASTER. Furthermore, the column address DCAij is decoded in response to the lagging edge of the delayed master clock signal COLMASTERD and the column selection line output signal CSL corresponding thereto is deactivated.

The operation of the semiconductor memory device shown in FIGS. 2 and 3 will now be further described with reference to the timing diagram shown in FIG. 5. When the column latch signal COLLAT and the data command signal COLCYC generated by the interface 10 are input to the master clock signal generator 50 in the memory controller 20, the master clock signal COLMASTER is activated in response to the column latch signal (and subsequently deactivated in response to the data command signal). The master clock signal COLMASTER is delayed for a selected time by the delay circuit 65.

The address Ai' is latched by the column address latch unit 70 when the column latch signal COLLAT is input to generate the column address CAi. The column address CAi and the delayed master clock signal COLMASTERD are input to the column decoder circuit 80 and the column selection line output signal CSL corresponding to the decoded column address DCAij is activated by the column decoder 84. The bit line sense amplifier 34 corresponding to the address selected by the column selection line output signal CSL is connected to the local input and output lines IO and IOB by the column selector 32. The bit line data signal amplified by the bit line sense amplifier 34 is thereby developed, with some time lag to develop the differential voltage signal due to line loading characteristics, on the local input and output lines IO and IOB.

The input/output sense amplifier enable circuit 90 is enabled responsive to the data command signal COLCYC, the leading edge of which is received after the leading edge of the column latch signal COLLAT. Accordingly, the input/output sense amplifier enable signal PIOSE is activated by the input/output sense amplifier enable circuit 90. The input/output sense amplifier 95 is enabled by the input/output sense amplifier enable signal PIOSE. The bit line data signal developed on the local input and output lines IO and IOB is thereby output to the global input and output line as the read data signal RD by the input/output sense amplifier 95.

In other words, according to the present invention, the column selection line output signal CSL is activated by the column latch signal COLLAT before the data command signal COLCYC is applied. The data then may be amplified and loaded on the local input and output lines IO and IOB. Therefore, when the data command signal COLCYC is applied and the input/output sense amplifier 95 is enabled, the data signal developed on the local input and output lines IO and IOB has already had an opportunity to be amplified to a sufficient differential voltage and is promptly output to the global input and output line.

According to the present invention, it is possible to reduce the potential time delay from generating the master clock signal COLMASTER, decoding a column, activating a column selection line and generating a certain voltage difference between the pairs of the local input and output lines IO and IOB. Therefore, compared with conventional memory devices in which the column selection line signal CSL is not enabled until after the data command signal COLCYC is input, the data signal RD is output more quickly following the data command signal COLCYC as the threshold voltage difference $\Delta$VIO between the data on the pair of the local input and output lines IO and IOB has already had time to develop. Therefore, $t_{DAC}$ may be reduced.

In other words, for example, in read operations for a semiconductor memory device according to the present invention, as the data command signal, which controls read and write operations of the column, is applied at a time after the column selection line has already been activated responsive to the preceding column latch signal, the input and output sense amplifier may be driven without delay after the data command signal is applied. Accordingly, the data can be promptly output. Therefore, the column selection speed may be improved and $t_{DAC}$, which is the time taken for the data to be output following receipt of the data command signal, may be reduced. Accordingly, the data read operating speed may be improved.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A memory device comprising:
   a memory array having bit line outputs;
   an interface circuit outputting a column latch signal, a data command signal and an address associated with the memory array;
   a column selection line circuit configured to decode the address responsive to the column latch signal and to activate a column selection line signal associated with a selected column of the memory array based on the decoded address responsive to a leading edge of the column latch signal and to deactivate the column selection line signal responsive to a leading edge of the data command signal;
   a sense amplifier coupled to the bit line outputs of the memory array and having an amplified output which outputs amplified bit line data from the memory array;
   a column selector circuit coupled to the column selection line signal and the amplified output of the sense amplifier and outputting selected amplified bit line data from the sense amplifier associated with the selected column of the memory array responsive to the column selection line signal; and
   a column address latch configured to latch the address responsive to a leading edge of the column latch signal; and
   wherein the column selection line circuit decodes the latched address and the column selection line circuit further comprises a delay circuit to delay activation of the column selection line for a selected time after the column address latch latches the address.

2. The memory device of claim 1 further comprising:
   an input/output sense amplifier enable circuit configured to generate an enable output responsive to the leading edge of the data command signal; and
   an input/output sense amplifier coupled to the selected amplified bit line data output of the column selector circuit, the input/output sense amplifier outputting read data corresponding to the selected amplified bit line data output of the column selector circuit responsive to the enable output of the input/output sense amplifier.

3. A column selection line driver for a memory device, the column selection line driver comprising:
   a column selection line circuit having a column selection line output and a column latch signal input, the column selection line circuit being configured to provide an activated signal on the column selection line output responsive to a column latch signal on the column latch signal input, the column selection line circuit further comprising:
      a master clock signal generator coupled to the column latch signal input and having a clock signal output which is activated responsive to the column latch signal on the column latch signal input;
      a column address latch having a column latch signal input and a column address output which is latched responsive to a column latch signal input on the column latch signal input; and
      a column decoder circuit coupled to the clock signal output and the column address output and the column selection line output, the column decoder circuit driving the column selection line output responsive to the clock signal input; and
   wherein the master clock signal generator further comprises:
      a first pulse generator coupled to the column latch input that generates an activate pulse responsive to the leading edge of the column latch input signal; and
      a master clock output device that activates the clock signal output responsive to the activate pulse.

4. The column selection line driver of claim 3 wherein the master clock signal generator further comprises:
   a second pulse generator coupled to a data command signal input of the master clock signal generator that generates a deactivate pulse responsive to a leading edge of a data command signal on the date signal input; and
   wherein the master clock output device deactivates the clock signal output responsive to the deactivate pulse.

5. The column selection line driver of claim 3 wherein the first pulse generator comprises:
   an inverter having an input coupled to the column latch input and having an associated delay; and
   a pulse output circuit having an input coupled to the column latch input and an input coupled to an output of the inverter wherein the activate pulse is generated when both the column latch input and the output of the invertor are activated.

6. The column selection line driver of claim 4 wherein the master clock output device comprises:
   a first transistor having a source coupled to a high voltage, the transistor being activated responsive to the activate pulse;
   a second transistor having a drain connected to a low voltage reference, the second transistor being activated responsive to the deactivate pulse; and
   a latch having an input coupled to the drain of the first transistor and the source of the second transistor.

7. The column selection line driver of claim 3 further comprising a delay circuit outputting a delayed clock signal responsive to the clock signal output of the master clock signal generator and wherein the column decoder circuit drives the column selection line output responsive to the delayed clock signal.

8. The column selection line driver of claim 3 wherein the memory device is a rambus DRAM.

9. A method for driving a memory device comprising the steps of:
   activating a selected column selection line responsive to a leading edge of a column latch signal;
   outputting data from a memory cell of the memory device amplified by a bit line sense amplifier to a local input/output line responsive to activation of the selected column selection line; and
   activating an input/output sense amplifier enable signal responsive to a leading edge of a data command signal;
   amplifying data from the local input/output line with an input/output sense amplifier responsive to the input/output sense amplifier enable signal.

10. The method of claim 9 wherein the step of activating a column selection line is followed by the step of deactivating the selected column selection line responsive to the leading edge of the data command signal.

11. The method of claim 9 wherein the step of activating the column selection line comprises the steps of:
   generating a master clock responsive to a leading edge of the column latch signal;
   delaying the master clock a selected time to provide a delayed master clock;
   decoding an address responsive to the delayed master clock;
   selecting the selected column selection line to activate responsive to the decoded address; and then
   activating the selected column selection line.

12. A memory device comprising:
   a memory array having bit line outputs;
   an interface circuit outputting a column latch signal, a data command signal and an address associated with the memory array;
   a sense amplifier coupled to the bit line outputs of the memory array and having an amplified output which outputs amplified bit line data from the memory array;
   a column selector circuit coupled to a column selection line signal and the amplified output of the sense amplifier and outputting selected amplified bit line data from the sense amplifier associated with a selected column of the memory array responsive to the column selection line signal; and
   a column selection line circuit configured to decode the address responsive to the column latch signal and to active the column selection line signal associated with the selected column of the memory array based on the decoded address responsive to the column latch signal, the column selection line circuit further comprising:
      a master clock signal generator that generates a clock signal which is activated responsive to the column latch signal, the master clock signal generator including a first pulse generator that generates an activate pulse responsive to a leading edge of the column latch signal and a master clock output device that activates the clock signal responsive to the activate pulse;
      a column address latch having a column address output which is latched responsive to the column latch signal; and
      a column decoder circuit that drives the column selection line signal responsive to the clock signal.

* * * * *